US010109508B2

(12) United States Patent
Ashidate et al.

(10) Patent No.: US 10,109,508 B2

(45) Date of Patent: Oct. 23, 2018

(54) SUBSTRATE PROCESSING DEVICE AND METHOD OF MANUFACTURING SEMICONDUCTOR DEVICE

(71) Applicant: TOSHIBA MEMORY CORPORATION, Minato-ku, Tokyo (JP)

(72) Inventors: Hiroaki Ashidate, Mie (JP); Katsuhiro Sato, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/446,966

(22) Filed: Mar. 1, 2017

(65) Prior Publication Data

US 2018/0082862 A1 Mar. 22, 2018

(30) Foreign Application Priority Data

Sep. 16, 2016 (JP) ................................ 2016-182163

(51) Int. Cl.

*H01L 21/67* (2006.01)
*H01L 21/311* (2006.01)

(52) U.S. Cl.

CPC .. *H01L 21/67092* (2013.01); *H01L 21/31111* (2013.01); *H01L 21/31144* (2013.01); *H01L 21/67253* (2013.01); *H01L 21/67265* (2013.01)

(58) Field of Classification Search

CPC ......... H01L 21/67086; H01L 21/02019; H01L 21/306; H01L 21/31111; H01L 31/028; H01L 22/00; H01L 21/6708; H01L 21/67265; H01L 21/31144; H01L 21/67092; H01L 21/67253

USPC ............ 156/345.13, 345.11, 345.16, 345.17, 156/345.18, 345.15, 345.24; 216/83, 84, 216/96, 98

See application file for complete search history.

(56) References Cited

U.S. PATENT DOCUMENTS 5,698,040 A * 12/1997 Guldi ................ H01L 21/67051 134/1.3
6,612,316 B2 9/2003 Kawaguchi
8,043,466 B1 * 10/2011 Shin ........................ C03C 15/00 156/345.13
2004/0035449 A1 * 2/2004 Nam ................ H01L 21/67057 134/56 R (Continued)

FOREIGN PATENT DOCUMENTS

JP 2001-127034 A 5/2001
JP 2004-146489 A 5/2004

(Continued)

*Primary Examiner* — Lan Vinh

(74) *Attorney, Agent, or Firm* — Foley & Lardner LLP

(57) ABSTRACT

A substrate processing device includes a bath configured to accommodate a plurality of substrates and configured to store a liquid for etching the plurality of substrates, a plurality of bubble generators configured to generate bubbles in the liquid, the bubble generators provided so as to correspond to each of the plurality of substrates, a measurement device configured to measure the generation state of the bubbles of at least one of the plurality of bubble generators, and a control device configured to individually control at least one of the plurality of bubble generators based on the measurement result of the measurement device.

10 Claims, 5 Drawing Sheets

(56) References Cited

U.S. PATENT DOCUMENTS

| | | | | |
|---|---|---|---|---|
| 2013/0312788 | A1* | 11/2013 | Kubo | B08B 3/12 134/1.3 |
| 2015/0197861 | A1* | 7/2015 | Tice | H01L 21/67086 216/91 |

FOREIGN PATENT DOCUMENTS

| | | | |
|---|---|---|---|
| JP | 2004-146739 | A | 5/2004 |
| JP | 2006-086409 | A | 3/2006 |

* cited by examiner 1
10
30
13
LIGHT EMITTING UNIT
LIGHT EMITTING UNIT
LIGHT EMITTING UNIT
14
LIGHT RECEIVING UNIT
LIGHT RECEIVING UNIT
LIGHT RECEIVING UNIT
40
20
15
CONTROL DEVICE
12
121
122
123

30a

30a

SUBSTRATE PROCESSING DEVICE AND METHOD OF MANUFACTURING SEMICONDUCTOR DEVICE

CROSS REFERENCE TO RELATED APPLICATIONS

This application claims the benefit of and priority to Japanese Patent Application No. 2016-182163, filed Sep. 16, 2016; the entire contents of which are incorporated herein by reference.

FIELD

Embodiments described herein relate generally to a substrate processing device and a method of manufacturing a semiconductor device.

BACKGROUND

By placing a plurality of wafer-shaped substrates in a bath in which a chemical solution is stored, multiple substrates may be etched at the same time. In this process, the chemical solution may flow on a respective surface of each substrate. At this time, if the flow velocity of the chemical solution flowing on the surface of each substrate is nonuniform between the substrates, an etching amount tends to differ between the substrates.

A method of generating bubbles in the chemical solution can be implemented to help make the flow velocity of the chemical solution uniform among substrates. When this method is used, if the generation state of bubbles (e.g. the rate at which bubbles are being generated) is not controlled, the nonuniformity of the flow velocity of the chemical solution may not be eliminated, and the etching amount may still differ among the substrates.

SUMMARY

In some embodiments, according to one aspect, a substrate processing device includes a bath configured to accommodate a plurality of substrates and configured to store a liquid for etching the plurality of substrates, a plurality of bubble generators configured to generate bubbles in the liquid, the bubble generators provided so as to correspond to each of the plurality of substrates, a measurement device configured to measure the generation state of the bubbles of at least one of the plurality of bubble generators, and a control device configured to individually control at least one of the plurality of bubble generators based on the measurement result of the measurement device.

In some embodiments, according to another aspect, a method of manufacturing a semiconductor device includes providing a bath in which a liquid is stored, a plurality of substrates, a measurement device, a control device and a plurality of bubble generators, each bubble generator corresponding to one substrate of the plurality of substrates, etching the plurality of substrates, generating bubbles in the liquid by using the plurality of bubble generators, measuring the generation state of the bubbles of at least one bubble generator of the plurality of bubble generators using the measurement device, and controlling, by the control device, at least one bubble generator of the plurality of bubble generators individually based on the measurement result of the bubble generation state.

DETAILED DESCRIPTION

Some example embodiments provide for a substrate processing device capable of controlling the generation state of bubbles in a liquid used for substrate processing, and a method of manufacturing such a semiconductor device.

In general, according to some embodiments, a substrate processing device includes a bath, a plurality of bubble generators, a measurement device and a control device (such as a semiconductor device including a central processing unit and associated memory storing executable instructions, and/or an application-specific integrated circuit). The bath is configured to accommodate a plurality of substrates and is configured to store a liquid for etching the plurality of substrates. The plurality of bubble generators are provided and respectively correspond to respective substrates of the plurality of substrates, and generate bubbles in the liquid. The measurement device measures the generation state of bubbles. The control device individually controls the plurality of bubble generators based on one or more measurement results of the measurement device.

Some embodiments described herein will be described below with reference to the accompanying drawings. The described embodiments are provided by way of example, and the present disclosure is not limited thereto.

(First Aspect)

Figure 1:
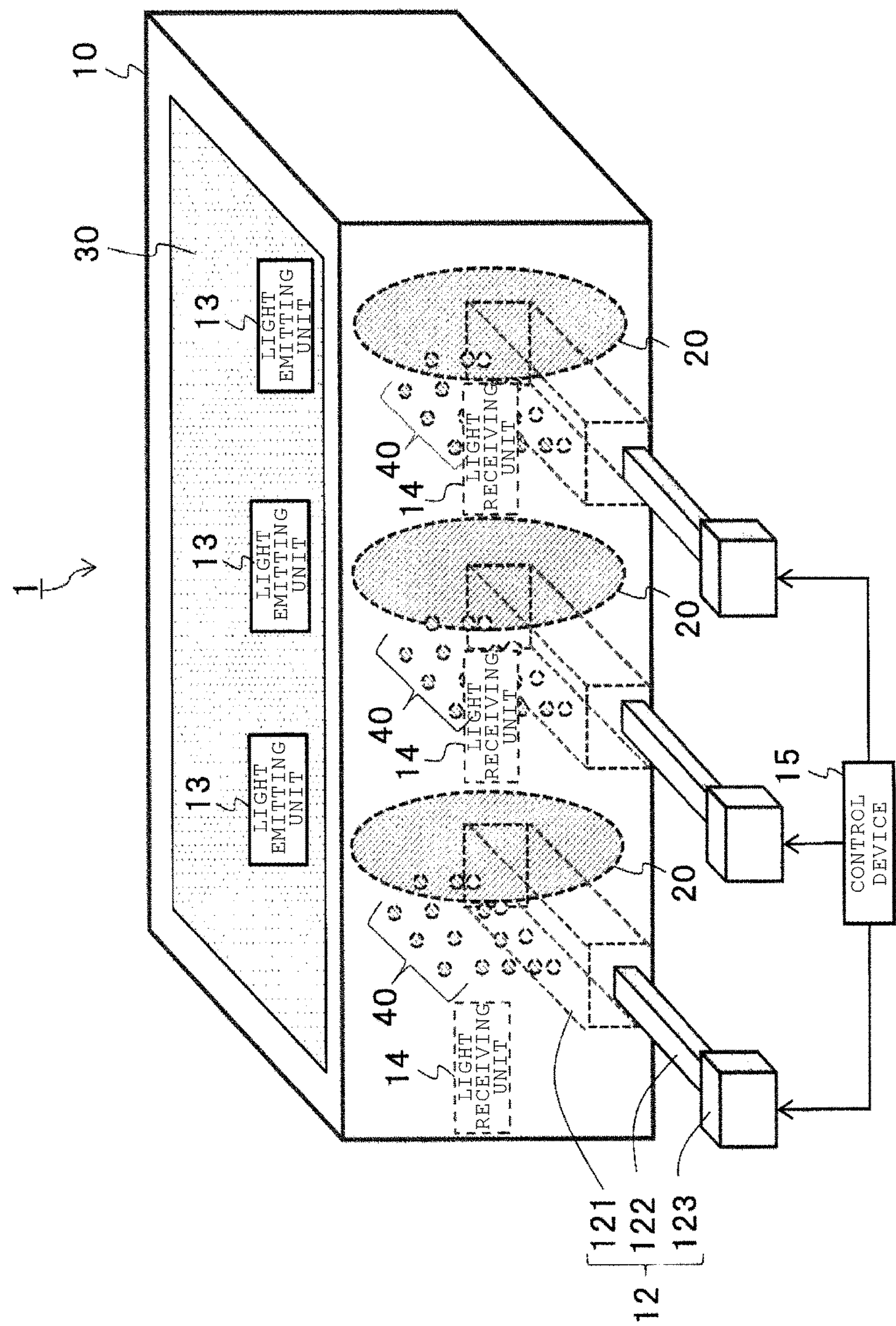
FIG. 1 is a schematic diagram schematically illustrating a configuration of some embodiments of a substrate processing device according to a first aspect.

FIG. 1 is a schematic diagram schematically illustrating a configuration of some embodiments of a substrate processing device according to a first aspect. The depicted embodiments of the substrate processing device 1 according to the first aspect is, for example, a wet etching processing device that simultaneously etches a plurality of wafer-shaped substrates 20 with a liquid 30. The substrate 20 is used for, for example, a three-dimensional memory in which word lines are stacked.

As illustrated in FIG. 1, the depicted embodiments of a substrate processing device 1 according to the first aspect include a bath 10, a plurality of bubble generators 12, a plurality of light emitting units 13, a plurality of light receiving units 14 and a control device 15.

The liquid 30 is stored in the bath 10. The liquid 30 is a chemical solution containing phosphoric acid, for example. The bath 10 accommodates a plurality of substrates 20.

Each bubble generator 12 includes a nozzle 121, a pipe 122 and a flow rate adjustment unit 123. The nozzle 121 is provided at the bottom of the bath 10. The nozzle 121 discharges bubbles 40 toward the upper portion of the bath 10. Each bubble generator may be disposed so as to correspond to a substrate 20, or to a location at which a substrate 20 may be disposed (e.g. may be proximate to, or disposed under, a substrate 20 or to a location at which a substrate 20 may be disposed).

The pipe 122 is connected to the nozzle 121 (e.g. is in liquid communication with the nozzle 121). Gas flows in the pipe 122. For example, nitrogen is used for this gas. The flow rate adjustment unit 123 is mounted on the pipe 122. The flow rate adjustment unit may include, for example, a valve.

Under the control of the control unit 15, the flow rate adjustment unit 123 adjusts the flow rate of the gas flowing in the pipe 122. The flow rate of the gas corresponds to a generation amount of the bubbles 40. That is, by adjusting the flow rate of the gas with the flow rate adjustment unit 123, the generation amount (discharge amount) of the bubbles 40 discharged from the nozzle 121 can be adjusted.

The plurality of light emitting units 13 and the plurality of light receiving units 14 are part of a measurement device that measures the generation state of the bubbles 40 of the plurality of bubble generators 12 (e.g. the rate at which the plurality of bubble generators 12 generate bubbles). The plurality of light emitting units 13 are provided on an upper surface of the bath 10 (e.g. on an top surface of the bath 10 on the outside of the bath 10), and emit light toward a movement path of the bubbles 40 discharged from each nozzle 121 (e.g. emit light in a vertical direction, as shown in FIG. 1). Each of the light emitting units 13 includes, for example, a light emitting diode.

The plurality of light receiving units 14 are provided on a surface of the bath 10 opposite the surface on which the light emitting units 13 are disposed (e.g. on a bottom surface of the bath 10 on the inside of the bath 10) so as to respectively face a respective one of the plurality of light emitting units 13, with the movement path interposed therebetween. Each light emitting unit 13 may emit light along a respective movement path, and a respective light receiving unit 14 may be positioned at an end of the movement path. Each of the light receiving units 14 includes, for example, a photodiode. Each light receiving unit 14 outputs a detected received light intensity to the control device 15. The received light intensity may correspond to the generation state of the bubbles 40. That is, the generation state of the bubbles 40 of each bubble generator 12 can be determined based on the received light intensity of one or more of the light receiving units 14.

The control device 15 controls each flow rate adjustment unit 123 based on the received light intensity of one or more light receiving units 14. For example, in some embodiments, the control device 15 controls each flow rate adjustment unit 123 based on the received light intensity of a single light receiving unit 14 that corresponds to the flow rate adjustment unit 123. In some embodiments, the control device 15 controls each flow rate adjustment unit 123 based on the received light intensity of more than one light receiving unit 14. At this time, the control device 15 controls each flow rate adjustment unit 123 so that the generation amount of the bubbles 40 discharged from each nozzle 121 becomes uniform.

Figure 2:
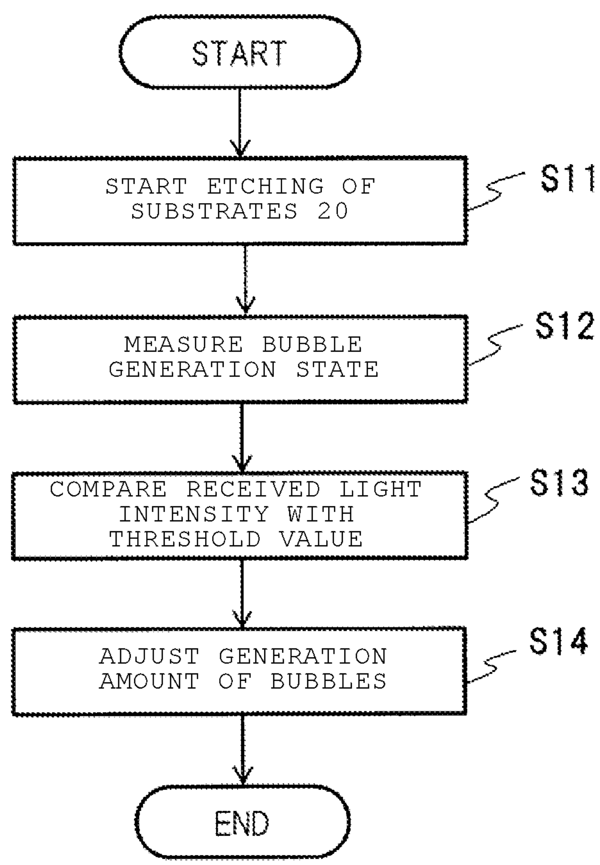
FIG. 2 is a flowchart illustrating some steps of some embodiments of a substrate processing process according to the first aspect.

Some embodiments of a manufacturing process of a semiconductor device according to some embodiments will now be described. Here, some embodiments of a substrate processing process which is one of the manufacturing processes will be described with reference to FIG. 2. FIG. 2 is a flowchart illustrating some steps of the substrate processing process.

First, etching of a plurality of substrates 20 is started (step S11). At step S11, the plurality of substrates 20 are accommodated in the bath 10 that stores the liquid 30. At this time, a temperature of the liquid 30 is heated to about 160° C., for example. For example, when the substrates 20 are immersed in the liquid 30, a silicon nitride film (not illustrated) provided on each substrate 20 is selectively etched with respect to a silicon oxide film (not illustrated). In some embodiments, a component of the substrate 20 other than a silicon nitride film may be etched by immersion in the liquid 30.

Next, the bubble generation state of each bubble generator 12 is measured using the plurality of light emitting units 13 and the plurality of light receiving units 14 (step S12). At step S12, each light receiving unit 14 receives light emitted from at least one respective light emitting unit 13 (step S12). In some embodiments, the light received at each light receiving unit 14 may be light emitted from all of the light emitting units 13 of the light substrate processing device 1. In some embodiments, light received by a light receiving unit 14 from a closest light emitting device 13 may correspond to a majority of the total received light, or may contribute more to the total received light than does any other light emitting unit 13, and the closest light emitting device 13 may be said to correspond to the light receiving unit 14. Each light receiving unit 14 outputs a respective detected received light intensity to the control device 15. The received light intensity corresponds to the generation state of the bubbles 40. That is, reflection or scattering of the light by the bubbles 40 generated by the bubble generators 12 causes a difference between the intensity of the light emitted from each light emitting unit 13 and the intensity of the light detected by each light receiving unit 14.

Next, the control device 15 compares the received light intensity acquired from each light receiving unit 14 with a preset threshold value (step S13). By this comparison, the control device 15 can distinguish between the bubble generator 12 generating a large amount of bubbles 40 and the bubble generator 12 generating a small amount of bubbles 40. That is, the control device 15 can detect the variation in the bubble generation amount of each bubble generator 12. In some embodiments more than one preset threshold value may be implemented, and the control device 15 can distinguish between more than two bubble generation states.

Following step S13, the control device 15 adjusts the generation amount of the bubbles 40 of at least one bubble generator 12 (step S14). For the bubble generator 12 that is determined to generate a small amount of bubbles 40 at step S13, the control device 15 increases the flow rate of the gas using the flow rate adjustment unit 123 in order to increase the generation amount of the bubbles 40.

Conversely, for the bubble generator 12 that is determined to generate a large amount of bubbles, the control device 15 reduces the flow rate of the gas using the flow rate adjustment unit 123 in order to reduce the generation amount of the bubbles 40.

According to the embodiments described above, the generation state of the bubbles 40 of each bubble generator 12 is measured using the plurality of light emitting units 13 and the plurality of light receiving units 14, and based on the measurement results, the generation amount of the bubbles 40 of at least one bubble generator 12 is adjusted. Thereby, a nonuniformity of the flow velocity of the liquid 30 flowing on the surface of each substrate 20 can be reduced. Thereby, variation in the etching amount among the substrates can be reduced.

(Second Aspect)

Figure 3:
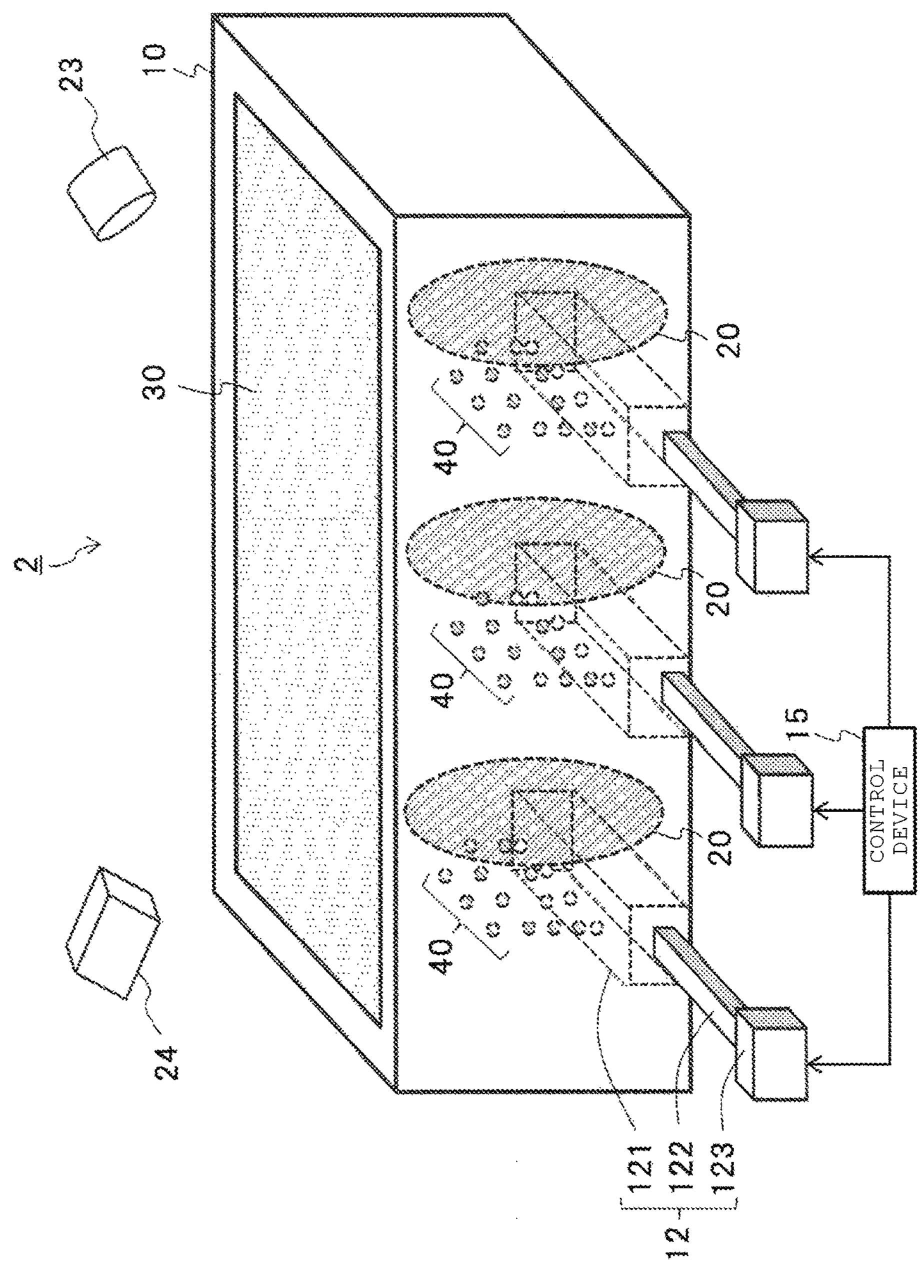
FIG. 3 is a schematic diagram schematically illustrating a configuration of some embodiments of a substrate processing device according to a second aspect.

FIG. 3 is a schematic diagram schematically illustrating a configuration of some embodiments of a substrate processing device according to a second aspect. In FIG. 3, components similar to those described above in reference to the first aspect are denoted by same reference numerals, and detailed description thereof will be omitted.

As illustrated in FIG. 3, some embodiments of a substrate processing device 2 according to the second aspect differ from the substrate processing device 1 according to the first aspect in that a light source 23 and an image capturing device 24 are provided instead of the light emitting units 13 and the light receiving units 14. In some embodiments according to the second aspect, the light source 23 and the image capturing device 24 are part of a measurement device that measures the generation state of bubbles 40 of the plurality of bubble generators 12.

The light source 23 is disposed on an upper portion of the bath 10 and/or above the bath 10 and irradiates a liquid surface of the liquid 30 with light. The image capturing device 24 captures an image of the liquid surface irradiated with the light of the light source 23. The image capturing device 24 outputs the captured image to the control device 15.

Figures 4, 5A, 5B:
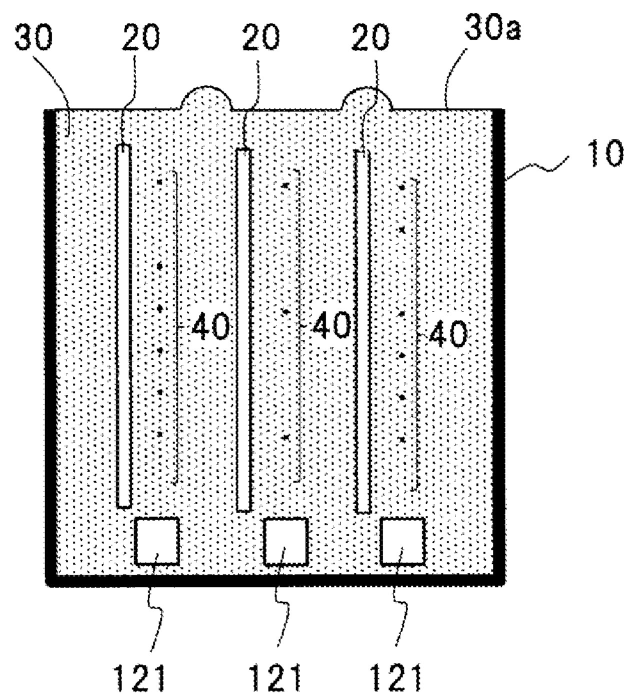
FIG. 4 is a side view of some embodiments of the substrate processing device illustrated in FIG. 3.
FIG. 5A is an enlarged view of a liquid surface illustrated in FIG. 4.
FIG. 5B is a diagram illustrating an example shape of a liquid surface when bubbles are uniformly generated.

FIG. 4 is a side view of some embodiments of the substrate processing device 2 illustrated in FIG. 3. FIG. 5A is an enlarged view of a liquid surface 30*a* illustrated in FIG. 4. FIG. 5B is a diagram illustrating an example shape of the liquid surface 30*a* when bubbles 40 are uniformly generated.

As illustrated in FIG. 4, for the liquid surface 30*a*, a region of the surface where a large amount of bubbles 40 are generated may be convex (e.g. the surface may tend to bubble up), while a region where a small amount of bubbles 40 are generated is relatively flat (e.g. the surface may bubble up less often or may not bubble up). An image captured by the image capturing device 24 may show a shape of the liquid surface 30*a* as illustrated in FIG. 5A. Further, in some embodiments according to the second aspect, a reference image corresponding to a shape of the liquid surface 30*a* (e.g. a desired shape corresponding to uniform bubble generation) as illustrated in FIG. 5B is stored in the control device 15.

In some embodiments according to the second aspect, the control device 15 compares the captured image to the reference image and determines the generation state of the bubbles 40. In some embodiments, the control device 15 compares the captured image to the reference image, identifies the shape of the liquid surface 30*a*, and determines the generation state of the bubbles 40. The shape of the liquid surface 30*a* may be identified using image processing techniques, for example.

Figure 6:
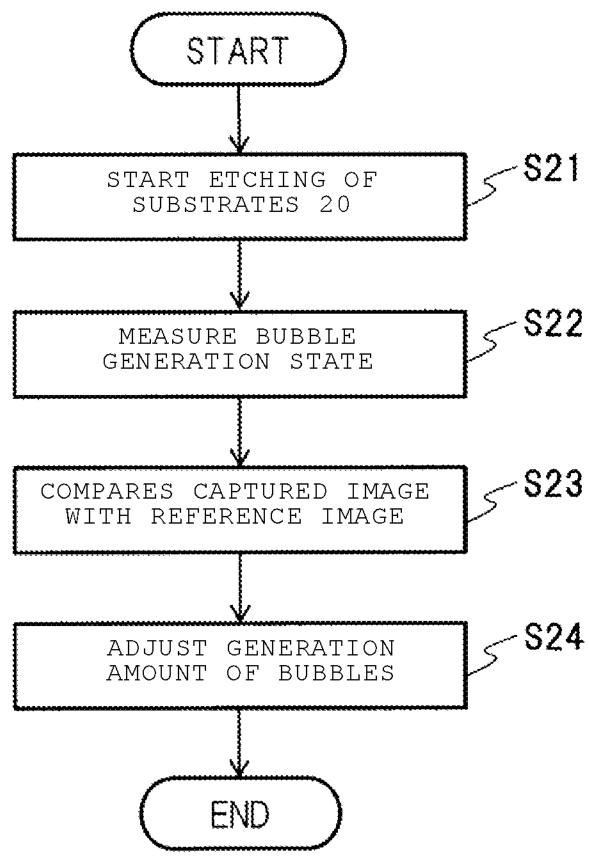
FIG. 6 is a flowchart illustrating some steps of some embodiments of a substrate processing process according to the second aspect.

Some embodiments of a manufacturing process of some embodiments of a semiconductor device according to the second aspect will now be described. Here, some embodiments of a substrate processing process which is one of the manufacturing processes will be described with reference to FIG. 6. FIG. 6 is a flowchart illustrating some steps of some embodiments of a substrate processing process according to the second aspect.

First, etching of a plurality of substrates 20 is started (step S21). Since the operation at step S21 is the same as the operation at step S11 in the first embodiment described above, the description thereof is omitted.

Next, the bubble generation state of each bubble generator 12 is measured using the light source 23 and the image capturing device 24 (step S22). At step S22, when the light source 23 irradiates the liquid surface 30*a* of the liquid 30 with light under the control of the control device 15, the image capturing device 24 captures an image of the liquid surface 30*a*. The image capturing device 24 outputs the captured image to the control device 15. The captured image shows the shape of the liquid surface 30*a*, from which the generation state of the bubbles 40 of the bubble generators 12 may be determined.

Next, the control device 15 compares image captured by the image capturing device 24 with the reference image (step S23). By this comparison, the control device 15 can identify a region where a small amount of bubbles is generated on the liquid surface 30*a*. That is, the control device 15 can identify one or more bubble generators 12 generating a small amount of bubbles.

Following step S23, the control device adjusts the generation amount of the bubbles 40 of at least one bubble generator 12 (step S24). At step S24, for a bubble generator 12 that is determined to generate a small amount of bubbles, the control device 15 increases the flow rate of the gas using the flow rate adjustment unit 123 in order to increase the generation amount of the bubbles 40. That is, the control device 15 adjusts the generation amount of the bubbles 40 so that the liquid surface 30*a* has the shape illustrated in FIG. 5B.

According to the embodiments described above, the shape of the liquid surface 30*a* is identified by using the light source 23 and the image capturing device 24. Then, based on the identified shape of the liquid surface 30*a*, the control unit 15 determines a generation amount of at least one bubble generator 12, and the generation amount of the bubbles 40 of at least one bubble generator 12 is adjusted. Therefore, with such a method, it is possible to reduce nonuniformity of the flow velocity of the liquid 30 flowing on the surface of each substrate 20, and to reduce the variation in the etching amount among the substrates.

In the embodiments described herein, although an image of the liquid surface 30*a* can be captured by one image capturing device 24, the number of the image capturing devices 24 is not particularly limited. For example, the liquid surface 30*a* may be divided into a plurality of regions, and images of respective regions may be captured by different image capturing devices 24. In this case, the control device 15 adjusts the generation amount of the bubbles 40 of at least one bubble generator 12 based on one or more captured images sent from the image capturing devices 24.

It is noted that the measurement device that measures the generation state of the bubbles 40 of at least one bubble generator 12 is not limited to those measurement devices that include any of the above-described light emitting unit 13, the light receiving unit 14, the light source 23 and the image capturing device 24. For example, a liquid level meter that detects the position of the liquid surface 30*a* by utilizing the fact that the specific gravity of the liquid 30 changes depending on the presence or absence of bubbles 40 may be used as the measurement device.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A substrate processing device, comprising:

a bath configured to accommodate a plurality of substrates and configured to store a liquid for etching the plurality of substrates;

a plurality of bubble generators configured to generate bubbles in the liquid, the bubble generators provided so as to correspond to each of the plurality of substrates;

a measurement device configured to measure the generation state of the bubbles of at least one of the plurality of bubble generators; and a control device configured to individually control at least one of the plurality of bubble generators based on the measurement result of the measurement device.

2. The device according to claim 1, wherein each bubble generator corresponds to a respective movement path of bubbles, and the measurement device includes a plurality of light emitting units configured to each emit light towards a respective movement path, and a plurality of light receiving units configured to individually face a respective one of the plurality of light emitting units with a respective movement path interposed therebetween, and the control device is configured to control the plurality of bubble generators based on the received light intensity of at least one of the light receiving units.

3. The device according to claim 2, wherein each bubble generator is provided at a bottom portion of the bath and each bubble generator includes a nozzle configured to discharge the bubbles toward an upper portion of the bath, a pipe in liquid communication with the nozzle, and a flow rate adjustment unit configured to adjust the flow rate of gas flowing in the pipe, and the control device is configured to control the flow rate adjustment unit based on a measurement result of the measurement device.

4. The device according to claim 2, wherein the control device is configured to compare the received light intensity with a preset threshold value and to adjust the generation amount of the bubbles of at least one of the bubble generators based on the comparison result.

5. The device according to claim 4, wherein each bubble generator is provided at a bottom portion of the bath and each bubble generator includes a nozzle configured to discharge the bubbles toward an upper portion of the bath, a pipe in liquid communication with the nozzle, and a flow rate adjustment unit configured to adjust the flow rate of gas flowing in the pipe, and the control device is configured to control the flow rate adjustment unit based on a measurement result of the measurement device.

6. The device according to claim 1, wherein the measurement device includes an image capturing device configured to capture an image of the liquid surface of the liquid, and the control device is configured to compare the captured image with a reference image and to adjust the generation amount of the bubbles of at least one bubble generator based on the comparison result.

7. The device according to claim 6, wherein each bubble generator is provided at a bottom portion of the bath and each bubble generator includes a nozzle configured to discharge the bubbles toward an upper portion of the bath, a pipe in liquid communication with the nozzle, and a flow rate adjustment unit configured to adjust the flow rate of gas flowing in the pipe, and the control device is configured to control the flow rate adjustment unit based on a measurement result of the measurement device.

8. The device according to claim 1, wherein each bubble generator is provided at a bottom portion of the bath and each bubble generator includes a nozzle configured to discharge the bubbles toward an upper portion of the bath, a pipe in liquid communication with the nozzle, and a flow rate adjustment unit configured to adjust the flow rate of gas flowing in the pipe, and the control device is configured to control the flow rate adjustment unit based on a measurement result of the measurement device.

9. The device according to claim 1, wherein the liquid includes phosphoric acid.

10. A method of manufacturing a semiconductor device, comprising:

providing a plurality of substrates, a measurement device, a control device, a plurality of bubble generators, each bubble generator corresponding to one substrate of the plurality of substrates, and a bath in which a liquid is stored;

etching the plurality of substrates;

generating bubbles in the liquid by using the plurality of bubble generators;

measuring the generation state of the bubbles of at least one bubble generator of the plurality of bubble generators using the measurement device; and controlling, by the control device, at least one bubble generator of the plurality of bubble generators individually based on the measurement result of the bubble generation state.

* * * * *